US006593872B2

(12) United States Patent
Makino et al.

(10) Patent No.: US 6,593,872 B2
(45) Date of Patent: Jul. 15, 2003

(54) SIGNAL PROCESSING APPARATUS AND METHOD, SIGNAL CODING APPARATUS AND METHOD, AND SIGNAL DECODING APPARATUS AND METHOD

(75) Inventors: Kenichi Makino, Kanagawa (JP); Jun Matsumoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/135,106

(22) Filed: Apr. 29, 2002

(65) Prior Publication Data

US 2003/0004713 A1 Jan. 2, 2003

(30) Foreign Application Priority Data

May 7, 2001 (JP) ....................................... 2001-136487

(51) Int. Cl.[7] .................................................. H03M 1/00
(52) U.S. Cl. ........................ 341/200; 704/229; 704/230
(58) Field of Search ................................. 704/230, 229, 704/222, 219, 214; 341/200, 143, 155, 144, 106

(56) References Cited

U.S. PATENT DOCUMENTS

| | | | | | |
|---|---|---|---|---|---|
| 5,848,387 | A | * | 12/1998 | Nishiguchi et al. | 704/214 |
| 5,966,688 | A | * | 10/1999 | Nandkumar et al. | 704/222 |
| 6,073,092 | A | * | 6/2000 | Kwon | 704/219 |
| 6,108,626 | A | * | 8/2000 | Cellario et al. | 704/230 |
| 6,385,575 | B1 | * | 5/2002 | Amada et al. | 704/222 |

* cited by examiner

*Primary Examiner*—Jean Bruner JeanGlaude
(74) *Attorney, Agent, or Firm*—Jay H. Maioli

(57) ABSTRACT

An apparatus and method for preventing a computation error of band-by-band bit allocation between an encoder and a decoder. In the encoder, an input LSP (line spectrum pair) coefficient is quantized by a quantization device, and a quantized output is output. In a codebook referring section, the look up of a codebook in which computation results are prestored is performed by using an LSP index of the first stage, and band-by-band bit allocation information is created. LSP indexes for each quantization stage are supplied to a decoder. In the decoder, the look up of the codebook is performed using the LSP index, and dequantization is performed on the basis of the created band-by-band bit allocation information.

32 Claims, 14 Drawing Sheets

SIGNAL PROCESSING APPARATUS AND METHOD, SIGNAL CODING APPARATUS AND METHOD, AND SIGNAL DECODING APPARATUS AND METHOD

BACKGROUND OF THE INVENTION

1. Field of the Invention

The present invention relates to a signal processing apparatus and method for performing signal processing associated with quantization, on an input parameter, and to a signal coding apparatus and method in which the signal processing apparatus is used. Also, the present invention relates to a signal processing apparatus and method for inputting an index of a quantized output from quantization means and for performing signal processing associated with dequantization, and to a signal decoding apparatus and method in which the signal processing apparatus is used.

2. Description of the Related Art

Hitherto, various coding methods for performing signal compression by using statistical properties in a time domain and a frequency domain of audio signals (including voice signals and musical signals) and auditory characteristics of a human being are known. Broadly speaking, examples of these coding methods include coding in a time domain, coding in a frequency domain, and analysis-synthesis coding.

In transform coding in which coding is performed by performing an orthogonal transform on an input signal on a time axis into a signal on a frequency axis, the following has been proposed that, with a view to achieving a lower bit rate, dynamic bit allocation corresponding to an input signal is performed and quantization of coefficient data on a frequency axis is performed. However, the calculation of this bit allocation is complex, and in particular, when coefficient data on a frequency axis is divided in units of several pieces and vector quantization is performed by using the divided data as subvectors, if the bit allocation for each coefficient is changed, the calculation of bit allocation for quantization is complicated.

Furthermore, when bit allocation changes dramatically for each frame, which is a transform unit for the orthogonal transform, there is a drawback in that reproduced sound is likely to become unstable.

For this reason, the applicant of the present invention previously proposed in Japanese Unexamined Patent Application Publication No. 12-132194 (hereinafter referred to as "the conventional art"), a signal coding apparatus and method, and a signal decoding apparatus and method, in which the calculations of bit allocation can be easily performed while dynamic bit allocation corresponding to an input signal is performed during the coding associated with the orthogonal transform, and in which reproduced sound does not become unstable even if bit allocation dramatically changes between frames.

In this conventional art, when coding is performed on an input signal on a time axis by using the orthogonal transform, a weight is computed according to the input signal, coefficient data obtained by being orthogonally transformed is assigned an order according to the order of this weight, and quantization with high accuracy is performed in accordance with this order. Therefore, even if bit allocation is performed dynamically according to the input signal, the calculation of the number of bits, which is assigned to each coefficient, can be performed simply.

Furthermore, by specifying parameters for calculating bit allocation in advance and by sending these parameters to a decoder side, it becomes unnecessary to send information of bit allocation to the decoder side, and thus the amount of additional information can be reduced, and a lower bit rate can be realized.

In the above-described conventional art, since there is a need that the results of a calculation of band-by-band bit allocation be completely the same between the coder and the decoder, the computation accuracy for this calculation needs to precisely agree between them.

However, for example, in a case where a signal coded by a coder which is implemented in a DSP (Digital Signal Processor) which performs fixed-point calculations is to be decoded by a decoder which is implemented in a personal computer, etc., if the decoder uses floating-point calculations, in spite of the fact that completely the same LSP (Line Spectrum Pair) codebook is referred to and the same codeword is input, a discrepancy in band-by-band bit allocation, resulting from computation errors, occurs between the coder and the decoder. Therefore, in this case, fixed-point calculations similar to those of a DSP need to be realized on a personal computer so that accuracy agrees to eliminate errors.

However, when computations to be performed by a fixed-point DSP having a general 40-bit accumulator is realized by a personal computer having a conventional 32-bit processor installed therein, a problem arises in that the number of computations becomes dramatically larger than when the same calculation is performed by floating-point calculation due to a limitation on the bit width of the processor.

SUMMARY OF THE INVENTION

The present invention has been proposed in view of the conventional situation. An object of the present invention is to provide a signal processing apparatus and method in which calculation results of band-by-band bit allocation are completely the same between a coder and a decoder, to provide a signal coding apparatus and method, and a signal decoding apparatus and method, in which the signal processing apparatus is used.

To achieve the above-mentioned object, in one aspect, the present invention provides a signal processing apparatus for performing signal processing associated with quantization on a first input parameter, the signal processing apparatus comprising: quantization means for quantizing the first parameter; and table referring means for preparing a table in which a result of a conversion of each representative value of a codebook is prestored and for determining a second parameter by referring to the table by using an index of a quantized output from the quantization means when the second parameter is to be determined on the basis of the first parameter quantized by the quantization means.

Such a signal processing apparatus prepares a table in which results of a conversion of each representative value of a codebook are prestored, and determines the second parameter by referring to the table using the index of the quantized output from the quantization means when a second parameter is determined on the basis of the first parameter quantized by the quantization means. Therefore, computations for parameter conversion do not need to be performed. Furthermore, since parameter conversion is also performed on the encoder side in a similar manner, a computation error between the encoder side and the decoder side can be prevented.

To achieve the above-mentioned object, in another aspect, the present invention provides a signal processing method for performing signal processing associated with quantization, on a first input parameter, the signal processing method comprising: a quantization step of quantizing the first parameter; and a table referring step of preparing a table in which a result of a conversion of each representative value of a codebook is prestored and determining a second parameter by referring to the table by using an index of a quantized output in the quantization step when the second parameter is to be determined on the basis of the first parameter quantized in the quantization step.

Such a signal processing method prepares a table in which a result of a conversion of each representative value of a codebook is prestored and determines a second parameter by referring to the table by using an index of a quantized output in the quantization step when the second parameter is to be determined on the basis of the first parameter quantized in the quantization step. Therefore, computations for parameter conversion do not need to be performed. Furthermore, since parameter conversion is also performed on the encoder side in a similar manner, a computation error between the encoder side and the decoder side can be prevented.

To achieve the above-mentioned object, in another aspect, the present invention provides a signal coding apparatus for performing coding by performing an orthogonal transform on a signal based on an input signal on a time axis and by performing bit allocation quantization on the obtained orthogonal transform coefficient, the signal coding apparatus comprising: orthogonal transform means for performing an orthogonal transform on a signal based on the input signal; parameter quantization means for quantizing a parameter based on the input signal; table referring means for preparing a table in which a result of a conversion of each representative value of a codebook is prestored and for determining bit allocation information by referring to the table by using an index of a quantized output from the quantization means when the bit allocation information is to be determined on the basis of the parameter quantized by the quantization means; and quantization means for performing bit allocation quantization on the orthogonal transform coefficient obtained by the orthogonal transform means on the basis of the bit allocation information determined by the table referring means.

Such a signal coding apparatus prepares a table in which a result of a conversion of each representative value of a codebook is prestored and determines bit allocation information by referring to the table by using an index of a quantized output from the quantization means when the bit allocation information is to be determined on the basis of the parameter quantized by the quantization means, and performs, in accordance with the bit allocation information, bit assignment quantization on the orthogonal transform coefficient obtained by performing an orthogonal transform on a signal based on the input signal. Therefore, computations for parameter conversion do not need to be performed. Furthermore, since parameter conversion is also performed on the encoder side in a similar manner, a computation error between the encoder side and the decoder side can be prevented.

To achieve the above-mentioned object, in another aspect, the present invention provides a signal coding method for performing coding by performing an orthogonal transform on a signal based on an input signal on a time axis and by performing bit allocation quantization on the obtained orthogonal transform coefficient, the signal coding method comprising: an orthogonal transform step of performing an orthogonal transform on a signal based on the input signal; a parameter quantization step of quantizing a parameter based on the input signal; a table referring step of preparing a table in which a result of a conversion of each representative value of a codebook is prestored and determining bit allocation information by referring to the table by using an index of a quantized output in the parameter quantization step when the bit allocation information is to be determined on the basis of the parameter quantized in the parameter quantization step; and a quantization step of performing bit allocation quantization on the orthogonal transform coefficient obtained in the orthogonal transform step on the basis of the bit allocation information determined in the table referring step.

Such a signal coding method prepares a table in which a result of a conversion of each representative value of a codebook is prestored and determines bit allocation information by referring to the table by using an index of a quantized output in the parameter quantization step when the bit allocation information is to be determined on the basis of the parameter quantized in the parameter quantization step, and performs bit allocation quantization on the orthogonal transform coefficient obtained by performing an orthogonal transform on a signal based on the input signal. Therefore, computations for parameter conversion do not need to be performed. Furthermore, since parameter conversion is also performed on the encoder side in a similar manner, a computation error between the encoder side and the decoder side can be prevented.

To achieve the above-mentioned object, in another aspect, the present invention provides a signal processing apparatus for inputting an index of a quantized output from the quantization means and for performing signal processing associated with dequantization, the signal processing apparatus comprising: dequantization means for dequantizing the index; and table referring means for preparing a table in which a result of a conversion of each representative value of a codebook is prestored and for creating a parameter by referring to the table by using the index.

Such a signal processing apparatus dequantizes an index of a quantized output, prepares a table in which a result of a conversion of each representative value of a codebook is prestored, and creates a parameter by referring to the table by using the index. Since parameter conversion is also performed on the encoder side in a similar manner, a computation error between the encoder side and the decoder side can be prevented.

To achieve the above-mentioned object, in another aspect, the present invention provides a signal processing method for inputting an index of a quantized output in quantization means and for performing signal processing associated with dequantization, the signal processing method comprising: a dequantization step of dequantizing the index; and a table referring step of preparing a table in which a result of a conversion of each representative value of a codebook is prestored and creating a parameter by referring to the table by using the index.

Such a signal processing method dequantizes an index of a quantized output, prepares a table in which a result of a conversion of each representative value of a codebook is prestored, and creates a parameter by referring to the table by using the index. Since parameter conversion is also performed on the encoder side in a similar manner, a computation error between the encoder side and the decoder side can be prevented.

To achieve the above-mentioned object, in another aspect, the present invention provides a signal decoding apparatus for inputting at least an index of a quantized output of a first parameter and a coded orthogonal transform coefficient from a signal coding apparatus which quantizes the first parameter based on the input signal and which performs bit allocation quantization on an orthogonal transform coefficient on the basis of the created bit allocation information by referring to a table in which a result of a conversion of each representative value of a codebook is prestored on the basis of the first quantized parameter when coding is to be performed by performing an orthogonal transform on the input signal on a time axis and by performing bit assignment quantization on the obtained orthogonal transform coefficient, the signal decoding apparatus comprising: table referring means for creating bit allocation information by referring to the table on the basis of the index; dequantization means for dequantizing the orthogonal transform coefficient on the basis of the bit allocation information created by the table referring means; and inverse orthogonal transform means for performing an inverse orthogonal transform on the orthogonal transform coefficient which is dequantized by the dequantization means.

Such a signal decoding apparatus inputs at least an index of a quantized output of a first parameter and a coded orthogonal transform coefficient from the signal coding apparatus, creates bit allocation information by referring to the table on the basis of the index, dequantizes the orthogonal transform coefficient on the basis of the created bit allocation information, and performs an inverse orthogonal transform on the dequantized orthogonal transform coefficient. Since bit allocation information is also created on the encoder side in a similar manner, a computation error between the encoder side and the decoder side can be prevented.

To achieve the above-mentioned object, in another aspect, the present invention provides a signal decoding method for inputting at least an index of a quantized output of a first parameter and a coded orthogonal transform coefficient from a signal coding apparatus which quantizes the first parameter based on the input signal and which performs bit allocation quantization on an orthogonal transform coefficient on the basis of the created bit allocation information by referring to a table in which a result of a conversion of each representative value of a codebook is prestored when coding is performed by performing an orthogonal transform on the input signal on a time axis and by performing bit allocation quantization on the obtained orthogonal transform coefficient, and for decoding the orthogonal transform coefficient on the basis of the index, the signal decoding method comprising: a table referring step of creating bit allocation information by referring to the table on the basis of the index; a dequantization step of dequantizing the orthogonal transform coefficient on the basis of the bit allocation information created in the table referring step; and an inverse orthogonal transform step of performing an inverse orthogonal transform on the orthogonal transform coefficient which is dequantized in the dequantization step.

Such a signal decoding method inputs at least an index of a quantized output of a first parameter and a coded orthogonal transform coefficient from the signal coding apparatus, creates bit allocation information by referring to the table on the basis of the index, dequantizes the orthogonal transform coefficient on the basis of the created bit allocation information, and performs an inverse orthogonal transform on the dequantized orthogonal transform coefficient. Since bit allocation information is also created on the encoder side in a similar manner, a computation error between the encoder side and the decoder side can be prevented.

DESCRIPTION OF THE PREFERRED EMBODIMENTS

Specific embodiments according to the present invention will be described below in detail with reference to the drawings. This embodiment is a signal processing apparatus according to the present invention, and a signal processing method in which the signal processing apparatus which quantizes an LSP coefficient by a multistage vector quantization and which determines band-by-band bit allocation information by parameter conversion from the quantized LSP coefficient is used. In the following, together with the description of this signal processing apparatus, a signal coding apparatus and a signal decoding apparatus in which the signal processing apparatus is used will also be described. In the following, for the sake of simplicity, a description is given by assuming that a multistage vector quantization of three stages is performed in the signal processing apparatus. However, of course, the present invention can be applied to a multistage vector quantization of N stages (N is an integer of 1 or more).

Figure 1:
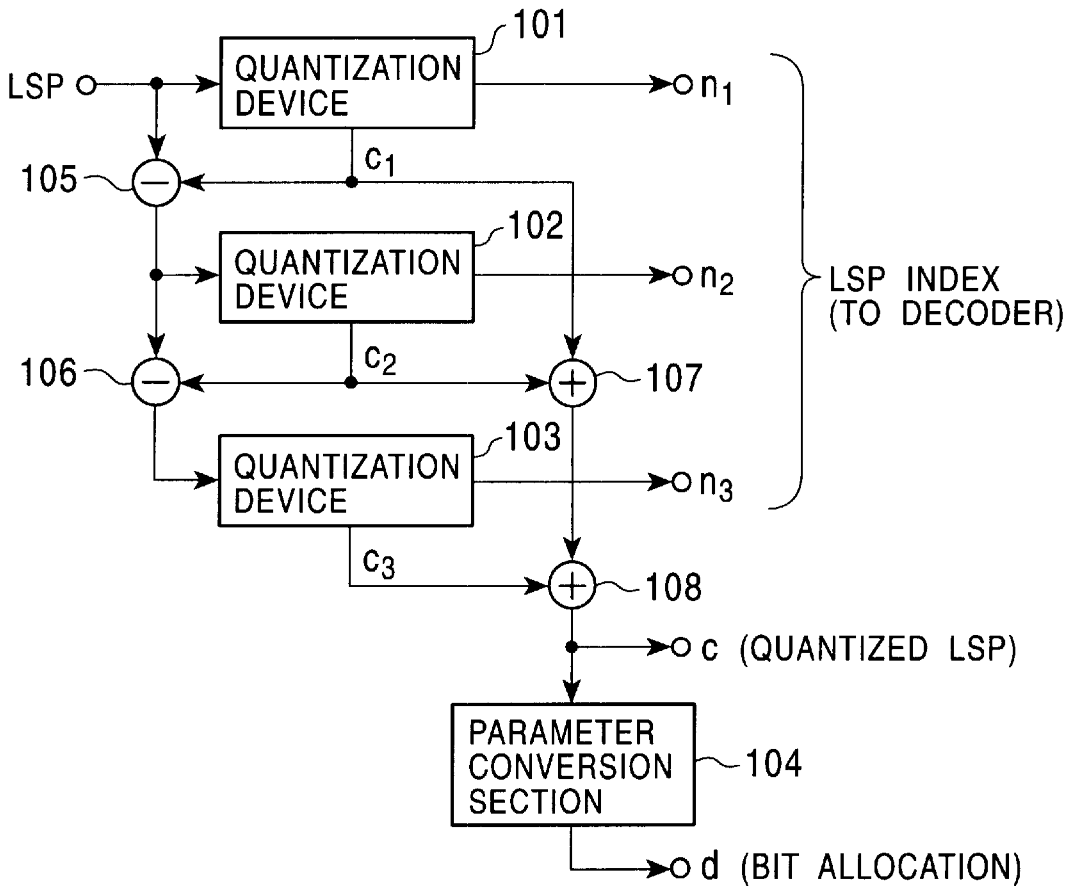
FIG. 1 illustrates a construction in a case where a parameter is converted by using a quantized output up to a third stage in a conventional signal processing apparatus.

First, before the signal processing apparatus of this embodiment is described, a conventional signal processing apparatus is described. As the overall construction of the conventional signal processing apparatus is shown in FIG. 1, the signal processing apparatus comprises quantization devices 101 to 103, a parameter conversion section 104, subtractors 105 and 106, and adders 107 and 108.

An LSP coefficient which is a first input parameter is quantized by the quantization device 101, and a quantized output $c_1$ is output. The quantized output $c_1$ is subtracted from the input LSP coefficient by the subtractor 105, and a quantized error thereof is quantized by the quantization device 102.

Similarly, a quantized output $c_2$ is subtracted from an input value of the quantization device 102, and a quantized error thereof is quantized in the quantization device 103.

The quantized outputs $c_1$, $c_2$, $c_3$ are added by adders 107 and 108 and become a quantized LSP. Furthermore, the quantized LSP is converted into band-by-band bit allocation information d which is a second parameter on the basis of a parameter conversion function F in the parameter conversion section 104. LSP indexes $n_1$, $n_2$, $n_3$ for each quantization stage are supplied to a decoder side.

Figure 2:
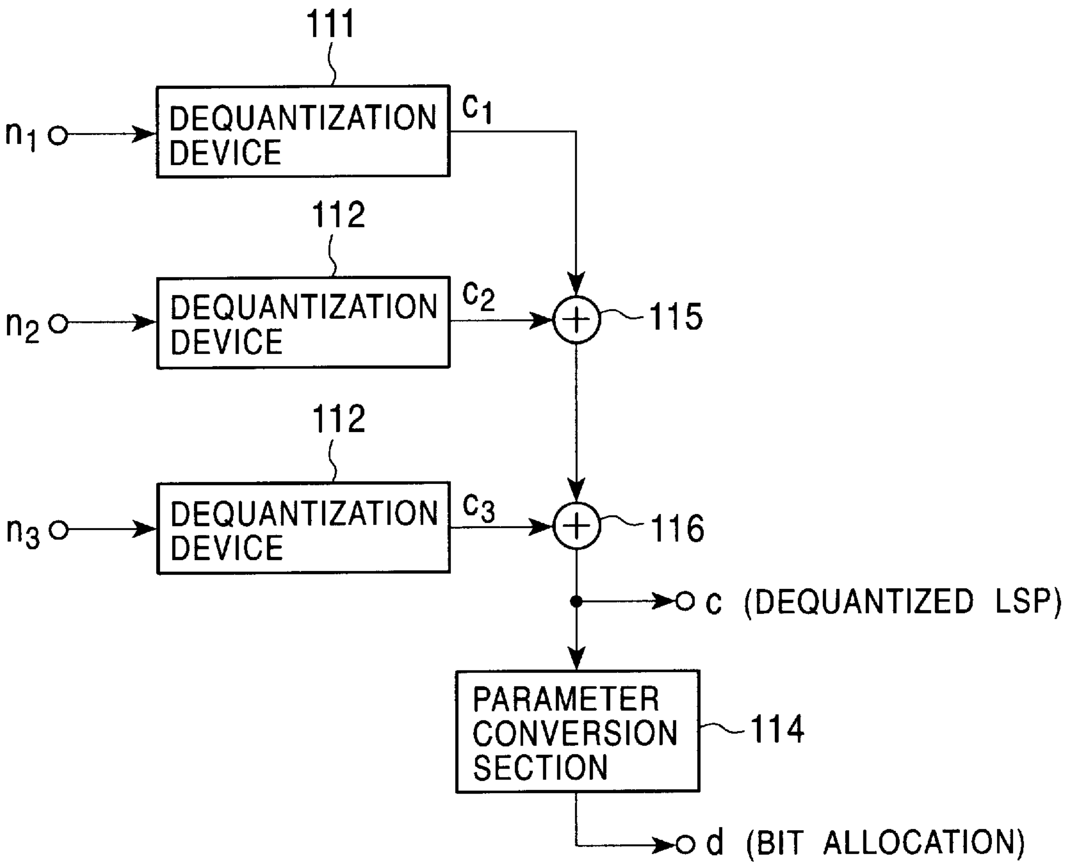
FIG. 2 illustrates a construction of a decoder side in a case where a parameter is converted on an encoder side by using a quantized output up to a third stage in a conventional signal processing apparatus.

As the overall construction of the decoder side is shown in FIG. 2, the decoder comprises dequantization devices 111 to 113, a parameter conversion section 114, and adders 115 and 116.

The LSP indexes $n_1$, $n_2$, $n_3$ supplied from the encoder side are input to the dequantization devices 111 to 113, and dequantized outputs $c_1$, $c_2$, $c_3$ are output, respectively. The dequantized outputs $c_1$, $c_2$, $c_3$ are added by the adders 115 and 116 and become a dequantized LSP. Furthermore, the dequantized LSP is converted into band-by-band bit allocation information d on the basis of a parameter conversion function in the parameter conversion section 114.

Figure 3:
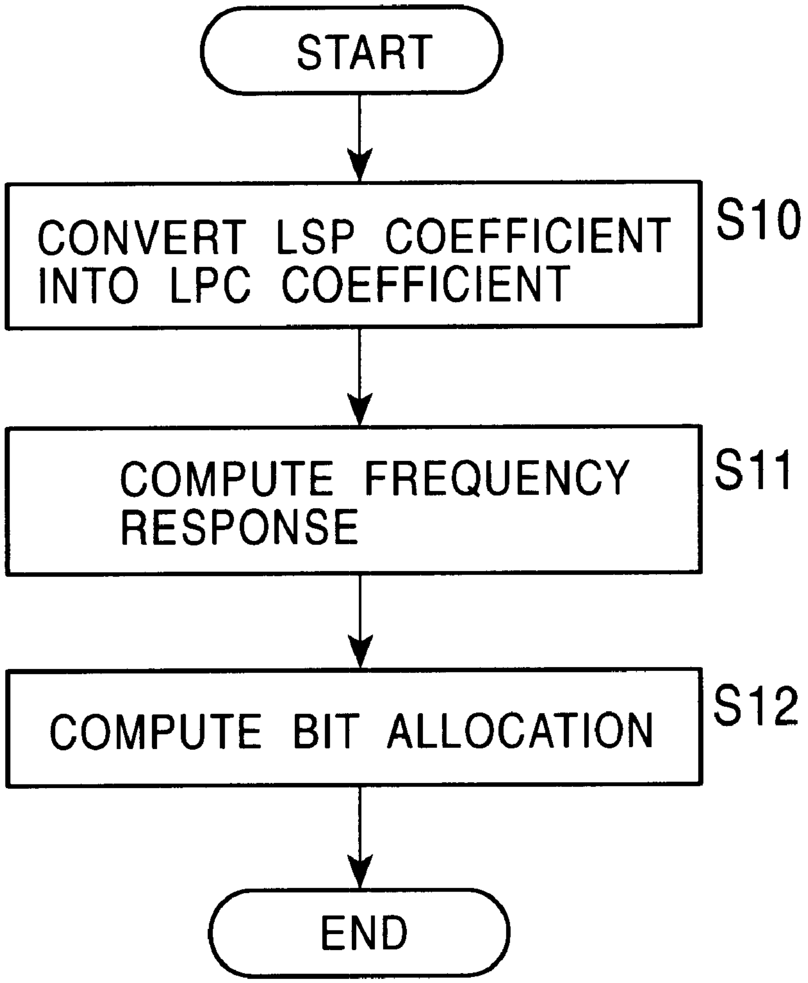
FIG. 3 is a flowchart illustrating a parameter conversion procedure.

Here, the parameter conversion sections 104 and 114 compute the band-by-band bit allocation information d by performing processing such as that shown in FIG. 3. Initially, in step S10, an LSP coefficient is converted into an LPC (Linear Predictive Coding) coefficient. Next, in step S11, a frequency response is computed, and in the subsequent step S12, bit allocation information is computed.

In the above description, parameter conversion is performed by using quantized results of three stages. However, when a quantized LSP is approximated satisfactorily by using only the quantized output $c_1$ of the first stage, only the quantized output $c_1$ of the first stage may be subjected to parameter conversion.

Figure 4:
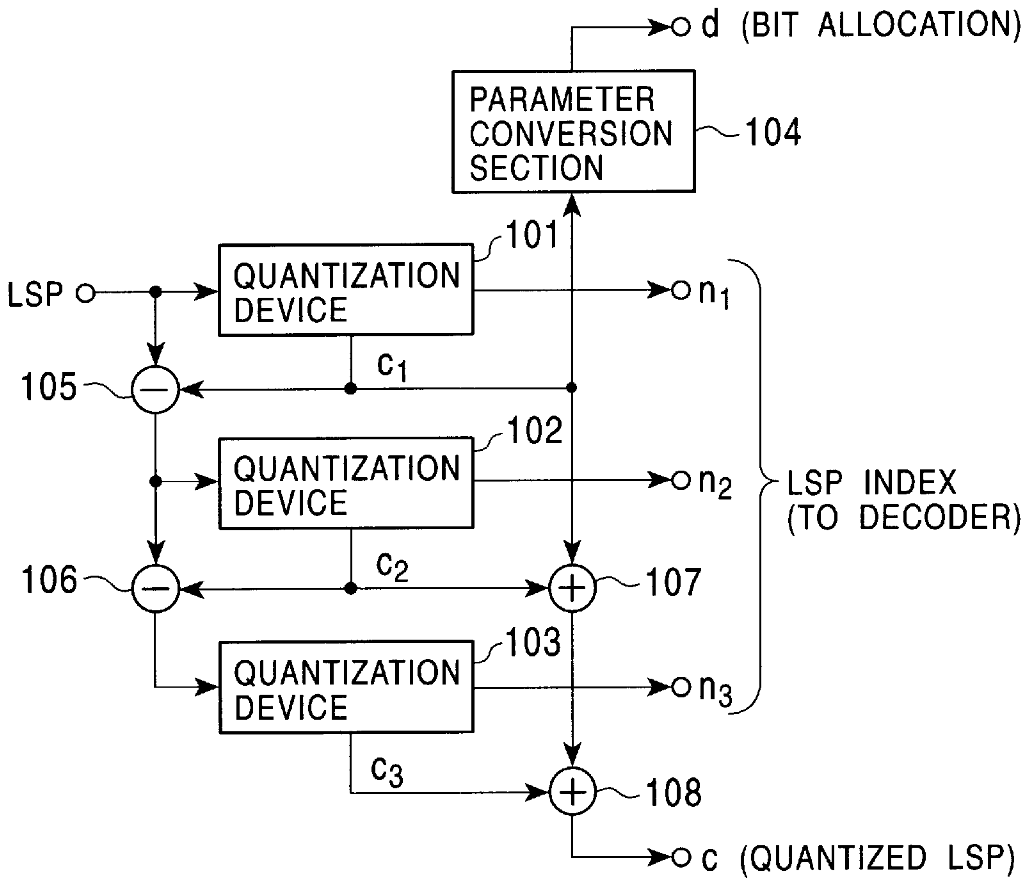
FIG. 4 illustrates a construction in a case where a parameter is converted by using a quantized output up to a first stage in a conventional signal processing apparatus.

The circuit configuration of the signal processing apparatus in this case is shown in FIG. 4. As shown in FIG. 4, the input LSP coefficient is quantized by the quantization device 101, and a quantized output $c_1$ is output. A quantized error of the first stage is quantized by the quantization device 102, and a quantized error of the second stage is quantized by the quantization device 103. The quantized outputs $c_1$, $c_2$, $c_3$ are added by the adders 107 and 108 and become a quantized LSP.

Here, the quantized output $c_1$ is converted into band-by-band bit allocation information d on the basis of a parameter conversion function F in the parameter conversion section 104. Furthermore, the LSP indexes $n_1$, $n_2$, $n_3$ for each quantized stage are supplied to the decoder side.

Figure 5:
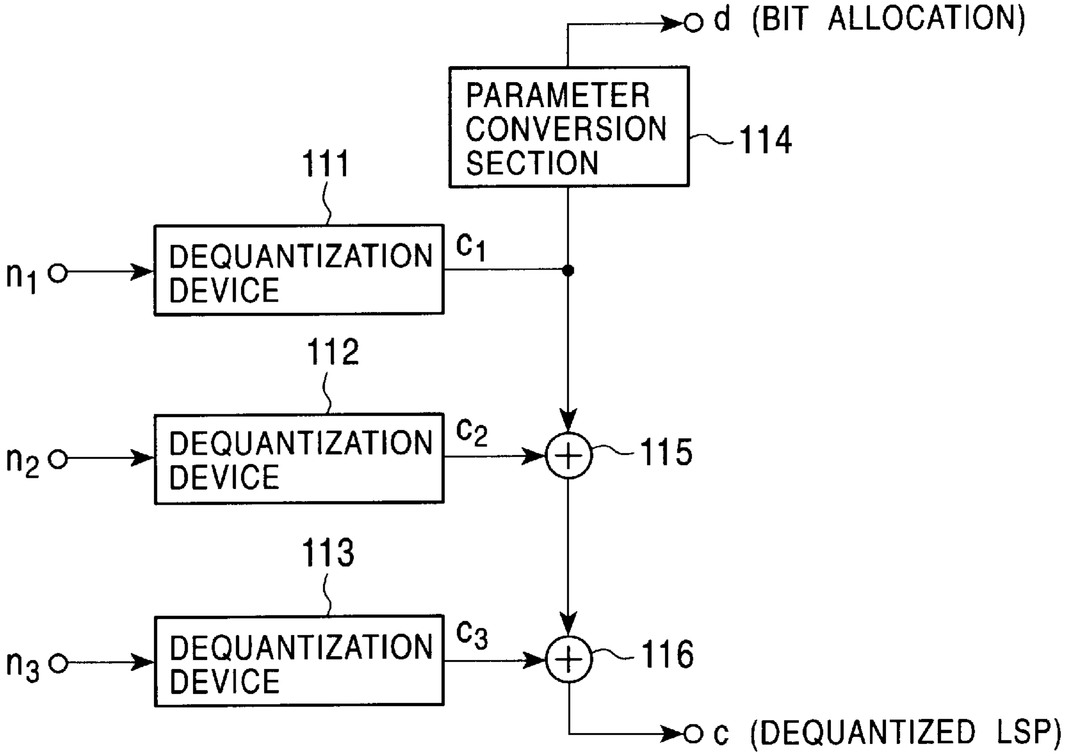
FIG. 5 illustrates a construction of a decoder side in a case where a parameter is converted on an encoder side by using a quantized output up to a first stage in a conventional signal processing apparatus.

As shown in FIG. 5, the LSP indexes $n_1$, $n_2$, $n_3$ supplied from the encoder side to the dequantization devices 111 to 113 are input to the decoder side, and dequantized outputs $c_1$, $c_2$, $c_3$ are output, respectively. The dequantized outputs $c_1$, $c_2$, $c_3$ are added by the adders 115 and 116, and become a dequantization LSP. Furthermore, the dequantized output $c_1$ is converted into band-by-band bit allocation information d on the basis of a parameter conversion function in the parameter conversion section 114.

Figure 6:
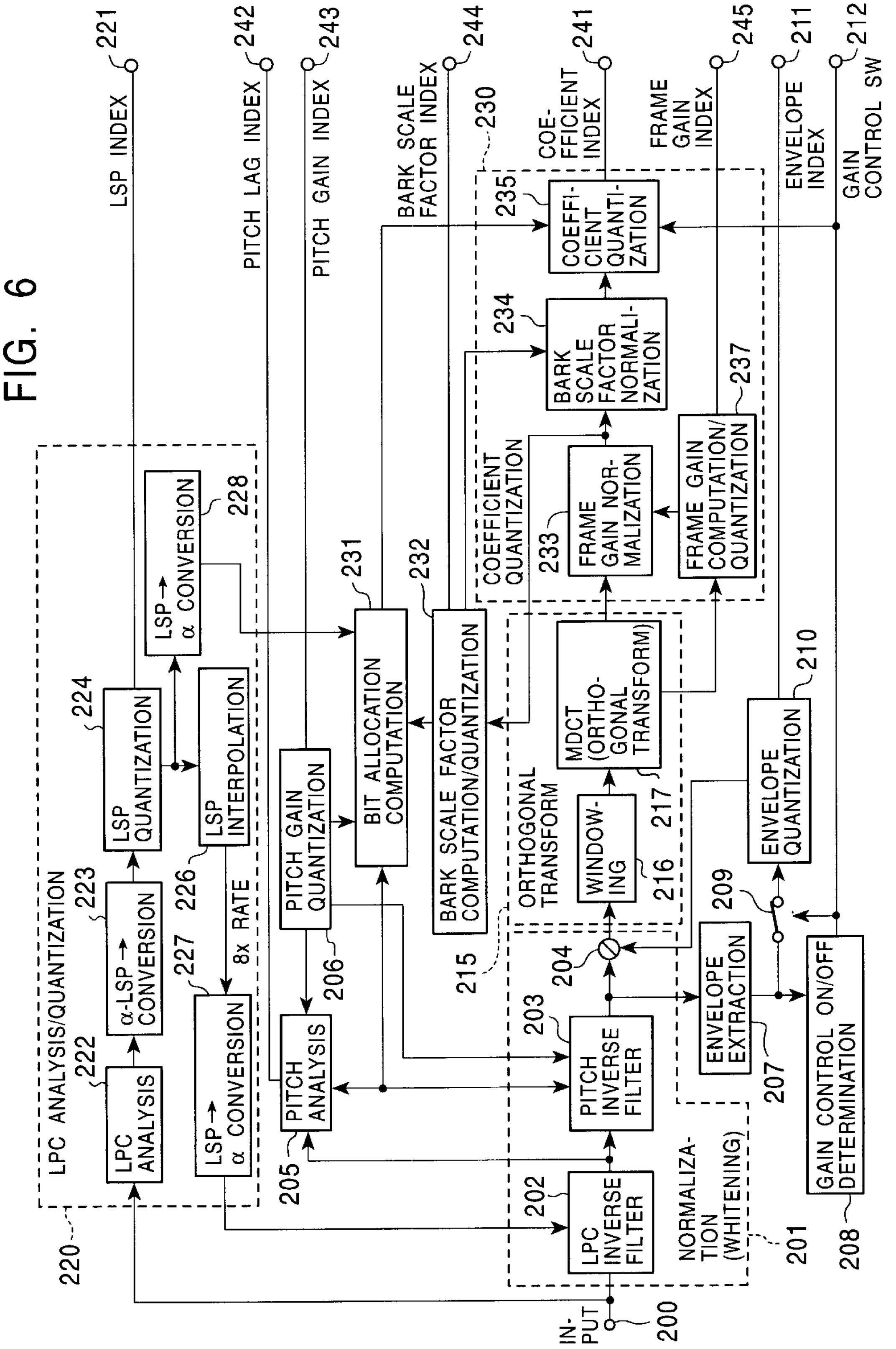
FIG. 6 illustrates the construction of a conventional signal coding apparatus.

Next, a signal coding apparatus in which the above-described signal processing apparatus is used is shown in FIG. 6. This signal coding apparatus has the same construction as that of the signal coding apparatus in Japanese Unexamined Patent Application Publication No. 12-132194 which was previously filed for a patent by the applicant of the present invention.

In FIG. 6, a digital audio signal such that, for example, a so-called wide-band audio signal of approximately 0 to 8 kHz is converted from analog into digital form at a sampling frequency Fs=16 kHz is supplied to an input terminal 200. This input signal is sent to an LPC inverse filter 202 of a normalization (whitening) circuit section 201. Furthermore, the input signal is extracted in units of, for example, 1024 samples, and these signals are sent to an LPC analysis/quantization section 220. In this LPC analysis/quantization section 220, after hamming windowing is performed, an LPC coefficient of approximately the twentieth order, that is, an α parameter, is computed, and an LPC residue is determined by the LPC inverse filter 202. During this LPC analysis, some of the 1024 samples per frame which is a unit of analysis, for example, 512 samples of a half thereof, are made to overlap with the next block, and the frame interval is 512 samples. This is for using aliasing cancellation of MDCT (Modified Discrete Cosine Transform) adopted as an orthogonal transform for later stages. In this LPC analysis/quantization section 220, an α parameter (an LPC coefficient) which is converted into an LSP parameter and which is quantized is transmitted.

The α parameter from the LPC analysis circuit 222 is sent to an α-to-LSP conversion circuit 223, where it is converted into an LSP parameter. For this conversion, the α parameter determined as a direct-type filter coefficient is converted into, for example, 20, namely, 10 pairs of LSP parameters. The conversion is performed by using, for example, a Newton-Raphson method. The reason for the conversion into an LSP parameter is that the LSP parameter has interpolation characteristics superior to those of the a parameter.

The LSP parameter from the α-to-LSP conversion circuit 223 is vector-quantized by an LSP quantization device 224. At this time, the vector quantization may be performed after an intra-frame difference is calculated. This LSP quantization device 224 corresponds to the signal processing apparatus on the encoder side. However, the parameter conversion section within the signal processing apparatus corresponds to an LSP-to-α conversion circuit 228 and a bit allocation computation circuit (bit allocation determination circuit) 231 (to be described later).

A quantized output from this LSP quantization device 224, that is, an index of LSP vector quantization, is extracted via a terminal 221. Furthermore, a quantized LSP vector or a dequantized output is sent to an LSP interpolation circuit 226 and the LSP-to-α conversion circuit 228.

The LSP interpolation circuit 226 is used to interpolate between the previous frame of the vector of the vector-quantized LSP and the current frame for each frame described above in the LSP quantization device 224 so as to reach a rate which is necessary for later processing, and in this example, the interpolation is performed to achieve an 8×rate.

In order to perform inverse filtering of input audio by using an LSP vector on which such interpolation is performed, the LSP-to-α conversion circuit 227 converts the LSP parameter into an α parameter which is a coefficient of a direct-type filter of, for example, approximately the twentieth order. An output from the LSP-to-α conversion circuit 227 is sent to the LPC inverse filter 202 for determining the LPC residue. In this LPC inverse filter 202, an inverse filtering process is performed on the basis of the α parameter updated at an 8×rate, so that a smooth output is obtained.

Furthermore, the 1×-rate LSP coefficient from the LSP quantization circuit 224 is sent to the LSP-to-α conversion circuit 228, where the 1×-rate LSP coefficient is converted into an α parameter, and this is sent to the bit allocation computation circuit 231 for performing bit allocation. In the bit allocation computation circuit 231, in addition to the calculation of allocation bits, the calculation of a weight w (ω) used for the quantization of an MDCT coefficient (to be described later) is also performed.

An output from the LPC inverse filter 202 of the normalization (whitening) circuit section 201 is sent to a pitch inverse filter 203 and a pitch analysis circuit 205 for pitch prediction which is a long-term prediction.

The long-term prediction is performed by determining pitch prediction residue by subtracting a waveform which is shifted on a time axis by the amount of a pitch period or a pitch lag, determined by pitch analysis, from the original waveform. In this example, the long-term prediction is performed by three-point pitch prediction. The "pitch lag" refers to the number of samples corresponding to the pitch period of the sampled time-axis data.

More specifically, in the pitch analysis circuit 205, pitch analysis is performed at the rate of once per frame, that is, at the rate of one frame of the analysis length. The pitch lag within the pitch analysis results is sent to the pitch inverse filter 203 and the bit allocation computation circuit 231, and the pitch gain is sent to a pitch gain quantization device 206. Furthermore, a pitch lag index from the pitch analysis circuit 205 is extracted from a terminal 242 and is sent to the decoder side.

In the pitch gain quantization device 206, a pitch gain at the three points corresponding to the above-described three-point prediction is subjected to a vector quantization, a codebook index (pitch gain index) is extracted from an output terminal 243, and a representative value vector or a dequantized output is sent to the pitch inverse filter 203. The pitch inverse filter 203 outputs a pitch prediction residue which was predicted from three pitches on the basis of the pitch analysis results. This pitch prediction residue is sent to a divider circuit 204 and an envelope extraction circuit 207.

In addition, for the signal coding apparatus, in the normalization (whitening) circuit section 201, a gain of intra-frame data is smoothed. In this processing, an envelope is extracted from the pitch inverse filter 203 by the envelope extraction circuit 207, the extracted envelope is sent to an envelope quantization device 210 via a switch 209, and the residue from the pitch inverse filter 203 is divided by the value of the quantized envelope, thereby obtaining the signal smoothed on a time axis. The signal from this divider 204 is sent as an output of the normalization (whitening) circuit section 201 to an orthogonal transform circuit section 215 at the next stage.

As a result of this smoothing, causing the magnitude of the quantization error when the orthogonal transform coefficient after being quantized is inversely transformed into a time signal, to track the envelope of the original signal, that is, a so-called noise shaping, can be realized.

In the envelope extraction circuit 207, when a signal supplied to the envelope extraction circuit 207, that is, a residue signal on which a normalization process has been performed by the LPC inverse filter 202 and the pitch inverse filter 203, is denoted as x(n), where n=0 to N−1 (N is the number of samples of one frame FR, an orthogonal transform window length, for example, N=1024), the rms (root mean square) for each subblock or each subframe which is cut out by the window of a length M which is shorter than the conversion window length N, for example, M=N/8, is assumed to be an envelope. In the envelope quantization device 210, a vector quantization is performed by assuming $rms_i$ of the i-th subblock (i=0 to M−1) as one vector. The index thereof is extracted as a parameter for time-axis gain control, that is, an envelope index, from a terminal 211, and this index is transmitted to the decoder side.

The determination as to whether or not gain control should be performed is performed by a gain control ON/OFF determination circuit 208. The determination output thereof (gain control SW) is sent as a switching control signal for a switch 209 on the input side of the envelope quantization device 210, and is sent to a coefficient quantization circuit 235 within a coefficient quantization section 230 (to be described later), where the switching control signal is used to switch the number of allocation bits of a coefficient between when the gain control is ON and when it is OFF. Furthermore, this gain control ON/OFF determination output (gain control SW) is extracted via a terminal 212 and is sent to the decoder side.

A signal $x_g(n)$ which is gain-controlled (or gain-compressed) by the divider 204 and which is smoothed on a time axis is sent as an output of the normalization circuit section 201 to the orthogonal transform circuit section 215, where the signal is converted into a frequency-axis parameter (coefficient data) by, for example, MDCT. This orthogonal transform circuit section 215 is formed of a windowing circuit 216 and an MDCT circuit 217. In the windowing circuit 216, windowing by a window function such that aliasing cancellation of MDCT by ½ frame overlapping can be used is performed.

The MDCT coefficient data obtained as a result of an MDCT process being performed by the MDCT circuit 217 of the orthogonal transform circuit section 215 is sent to a frame gain normalization circuit 233 and a frame gain computation/quantization circuit 237 of the coefficient quantization section 230. In the coefficient quantization section 230 of this embodiment, first, a frame gain (block gain) of all the coefficients of one frame which is the MDCT transform block is computed, and gain normalization is performed thereon, after which the gain is divided into critical bands which are sub-bands in which the higher the frequency, the larger the band width in accordance with the sense of hearing. Then, a scale factor, that is, what is commonly called a Bark scale factor, for each band thereof is computed, and based on this factor, a normalization is performed again. For the Bark scale factor, a peak value of a coefficient within that band for each band, a root mean square (rms), etc., can be used, and the Bark scale factor for each band is subjected to a vector quantization collectively.

More specifically, in the frame gain computation/quantization circuit 237 of the coefficient quantization section 230, the gain for each frame which is the MDCT transform block is computed and is quantized. A codebook index (frame gain index) thereof is extracted via a terminal 245 and is sent to the decoder side. Furthermore, the frame gain of the quantized value is sent to the frame gain normalization circuit 233, where a normalization based on the division of an input by a frame gain is performed. The output normalized by this frame gain is sent to a Bark scale factor computation/quantization circuit 232 and a Bark scale factor normalization circuit 234.

In the Bark scale factor computation/quantization circuit 232, the Bark scale factor for each critical band is computed and quantized, and a codebook index (Bark scale factor index) is taken out via a terminal 244 and is sent to the decoder side. Furthermore, the Bark scale factor of the quantized value is sent to the bit allocation computation circuit 231 and the Bark scale factor normalization circuit 234. In the Bark scale factor normalization circuit 234, a normalization of the coefficient within the band is performed for each critical band, and the coefficient normalized by the Bark scale factor is sent to the coefficient quantization circuit 235.

In the coefficient quantization circuit 235, the number of quantization bits is assigned to each coefficient in accordance with the bit allocation information from the bit allocation computation circuit 231, and a normalization is performed. At this time, the number of all the allocation bits is switched in accordance with the gain control SW information from the gain control ON/OFF determination circuit 208. For this switching, for example, when a vector quantization is to be performed, two sets of codebooks for a case in which the gain control is ON and for a case in which the gain control is OFF may be prepared, so that these codebooks are switched in accordance with the gain control SW information. The coefficient index quantized by the coefficient quantization circuit 235 is extracted via a terminal 241 and is sent to the decoder side.

The signal coding apparatus codes a signal which is input through such a construction as that described above. Next, an example of the construction of a signal decoding apparatus (the decoder side) corresponding to the signal coding apparatus (the encoder side) is shown in FIG. 7.

Figure 7:
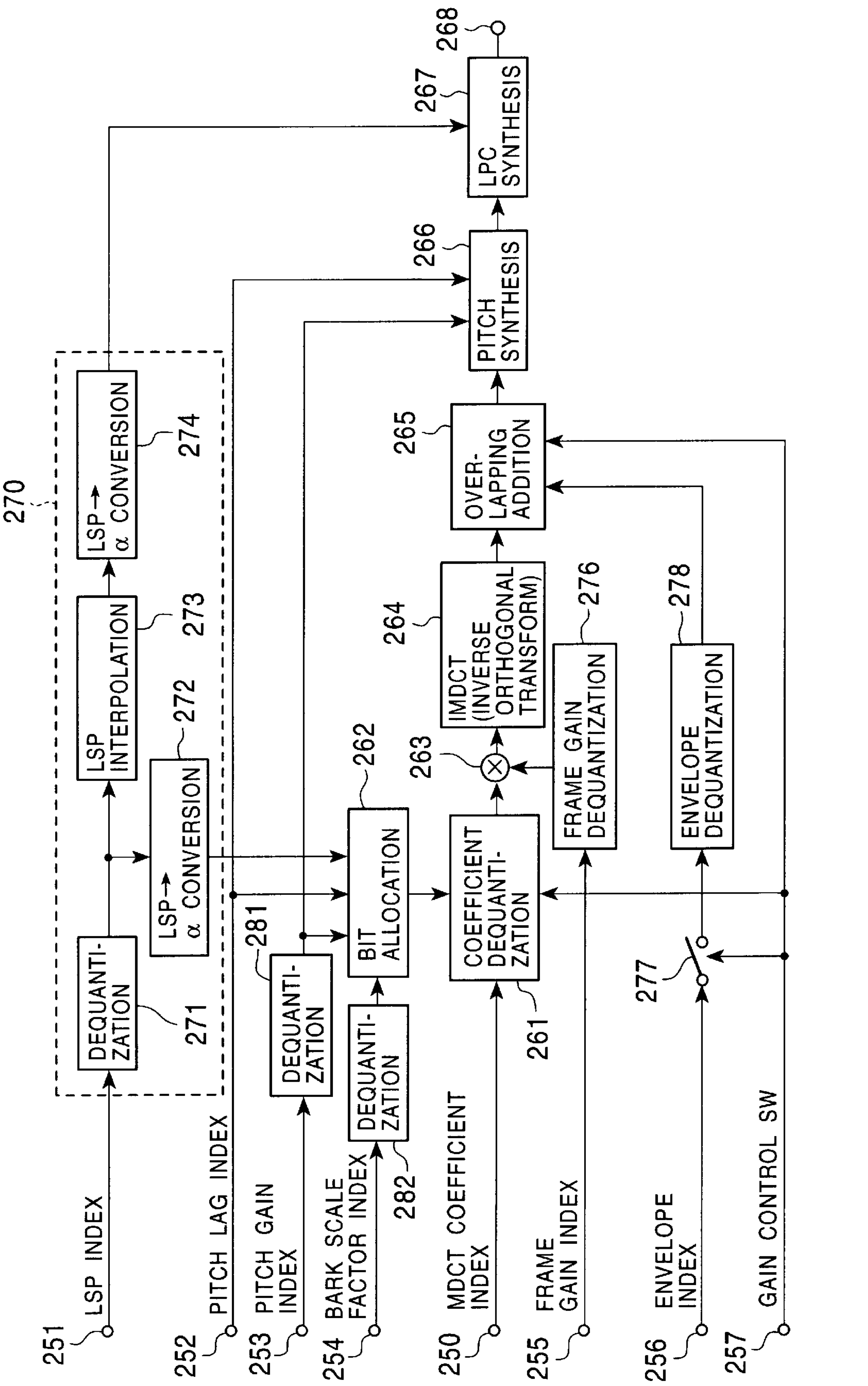
FIG. 7 illustrates the construction of a conventional signal decoding apparatus.

In FIG. 7, data from each of the output terminals in FIG. 6 is supplied to each of the input terminals 250 to 257. An index of an orthogonal transform coefficient (for example, an MDCT coefficient) from the output terminal 241 of FIG. 6 is supplied to the input terminal 250 of FIG. 7. An LSP index from the output terminal 221 of FIG. 6 is supplied to the input terminal 251. Data from each of the output terminals 242 to 245 of FIG. 6, that is, a pitch lag index, a pitch gain index, a Bark scale factor index, and a frame gain index, is supplied to the input terminals 252 to 255, respectively. An envelope index and gain control SW from the output terminals 211 and 212 of FIG. 6 are supplied to the input terminals 256 and 257, respectively.

The coefficient index from the input terminal 250 is dequantized by a coefficient dequantization circuit 261 and is sent to an inverse orthogonal transform circuit 264, such as an IMDCT (inverse MDCT), via a multiplier 263.

The LSP index from the input terminal 251 is sent to an inverse quantization device 271 of an LPC parameter reproduction section 270, where the LSP index is dequantized, and this LSP index is sent to an LSP-to-α conversion circuit 272 and an LSP interpolation circuit 273. The α parameter (LPC coefficient) from the LSP-to-α conversion circuit 272 is sent to a bit allocation circuit 262. The LSP data from the LSP interpolation circuit 273 is converted into an α parameter (LPC coefficient) by an LSP-to-α conversion circuit 274, and this parameter is sent to an LPC synthesis circuit 267 (to be described later).

In addition to the LPC coefficient from the LSP-to-α conversion circuit 272, the pitch lag from the input terminal 252, the pitch gain obtained from the input terminal 253 via a dequantization device 281, and the Bark scale factor obtained from the input terminal 254 via a dequantization device 282 are supplied to the bit allocation circuit 262. As a consequence, the bit allocation circuit 262 can reproduce the same bit allocation as that on the encoder side on the basis of only these parameters. The bit allocation information from the bit allocation circuit 262 is sent to the coefficient dequantization device 261, where the bit allocation information is used to determine the quantization allocation bits of each coefficient.

The frame gain index from the input terminal 255 is sent to a frame gain dequantization device 276, where the frame gain index is dequantized, and the obtained frame gain is sent to the multiplier 263.

The envelope index from the input terminal 256 is sent via a switch 277 to an envelope dequantization device 278, where the envelope index is dequantized, and the obtained envelope data is sent to an overlapping addition circuit 265. Furthermore, the gain control SW information from the input terminal 257 is sent to the coefficient dequantization device 261 and the overlapping addition circuit 265, and is used as a control signal for the switch 277. The inverse quantization device 271 switches the number of all the allocation bits according to ON/OFF of gain control such as that described above. In the case of an inverse vector quantization, the codebook when the gain control is ON and the codebook when the gain control is OFF may be switched.

The overlapping addition circuit 265 adds a signal returned to the time axis for each frame from the inverse orthogonal transform circuit 264 such as IMDCT while causing the signal to overlap in units of ½ frames. When the gain control is ON, the overlapping addition circuit 265 performs overlapping addition while performing a gain control (the above-described gain decompression or gain recovery) process on the basis of the envelope data from the envelope dequantization device 278.

The time-axis signal from the overlapping addition circuit 265 is sent to a pitch synthesis circuit 266, where pitch components are recovered. This corresponds to a process reverse to the processing in the pitch inverse filter 203 in FIG. 6, and the pitch lag from the terminal 252 and the pitch gain from the dequantization device 281 are used.

The output from the pitch synthesis circuit 266 is sent to an LPC synthesis circuit 267, where an LPC synthesis process corresponding to a process reverse to the processing in the LPC inverse filter 202 is performed, and the resulting data is taken out from an output terminal 268.

With such a construction, the signal decoding apparatus decodes a signal which is input from the encoder side.

In the manner described above, in the signal processing apparatus, since there is a need that the results of a calculation of band-by-band bit allocation be completely the same between the coder and the decoder, the computation accuracy for this calculation needs to precisely agree between them.

However, for example, in a case where a signal encoded by a coder which is implemented in a DSP (Digital Signal Processor) which performs fixed-point calculations is to be decoded by a decoder which is implemented in a personal computer, etc., if the decoder uses floating-point calculations, in spite of the fact that completely the same LSP codebook is referred to and the same codeword is input, a discrepancy in a quantization weight, caused by computation errors, occurs between the coder and the decoder. Therefore, in this case, fixed-point calculations similar to those of a DSP need to be realized on a personal computer so that accuracy agrees to eliminate errors. As a result, a problem arises in that the number of computations is dramatically increased.

More specifically, if a codebook is denoted as C, a code vector of the codebook C is denoted as c, and a function for inputting c and converting it into a target parameter d is denoted as F, the following is satisfied:

$$F(c)=d$$

However, if a calculation is performed using a function F' which is mathematically equivalent to F, a result containing an error δ, such as that described below, is output:

$$F'(c)=d+\delta$$

At this time, compared to a case in which a conversion is performed by a certain processor on the basis of F, if a calculation having completely the same value without errors is made by another processor, a problem of the number of computations being dramatically increased arises.

Therefore, the signal processing apparatus of this embodiment calculates F(c) in advance with respect to all the code vectors contained in the codebook C and stores the result d in another codebook. Then, during coding, by subtracting the code vector of a codebook D by using a quantized index from the codebook C, a parameter conversion from c to d is performed. Also, during decoding, by subtracting the code vector of the codebook D by using a quantized index of the codebook C, a parameter conversion from c to d is performed.

When this method is used in a multistage vector quantization, for example, in a multistage vector quantization of three stages with each stage being, for example, 8 bits long, for the code vector to be output, $2^{8*3}$ (=16777216) combinations exist. Therefore, conversions of code vectors must be performed for all these combinations. However, since the amount of the storage of the codebooks becomes enormous, this is not practical.

Here, a quantized output c of a general multistage vector quantization of N stages is represented by a linear sum of a code vector $c_i$ of a codebook of each stage, as shown in the following equation (1):

$$c=\sum_{i=1}^{N} c_i \tag{1}$$

Therefore, when the function F which performs a parameter conversion is linear, the following equation (2) is satisfied:

$$\begin{aligned} F(c) &= F\left(\sum_{i=1}^{N} c_i\right) \\ &= \sum_{i=1}^{N} F(c_i) \\ &= \sum_{i=1}^{N} d_i \end{aligned} \tag{2}$$

For this reason, if each codebook $C_i$ of each stage is converted by F in order to create a codebook $D_i$, and the linear sum of $d_i$ from which the codebook $D_i$ is subtracted at the index of the first stage is calculated, the parameter of the conversion target can be obtained. In addition to a multistage vector quantization, this method can also be applied to a vector quantization such that a plurality of codebooks are provided and that the quantized result is output as a linear sum of the code vectors of each codebook.

Here, in the general multistage vector quantization, since the quantization device of a later stage quantizes a quantized error of a previous stage, the above-described equation (2) can be approximated by using the quantized results up to the M-th stage as shown in the following equation (3):

$$\begin{aligned} F(c) &= F\left(\sum_{i=1}^{N} c_i\right) \\ &= F\left(\sum_{i=1}^{M} c_i\right) \\ &= \sum_{i=1}^{M} d_i (1 \le M < N) \end{aligned} \tag{3}$$

However, since the parameter conversion function F is non-linear, the codebook D cannot be created on the basis of equation (2). In this case, M is set to 1 in equation (3), and the codebook D is created based on the following equation (4):

$$\begin{aligned} F(c) &= F\left(\sum_{i=1}^{1} c_i\right) \\ &= F(c_1) \end{aligned} \tag{4}$$

As described above, in a case where the quantized result c is approximated satisfactorily using only the quantized result of the first stage, this method can be applied even if the parameter conversion function is non-linear.

Figure 8:
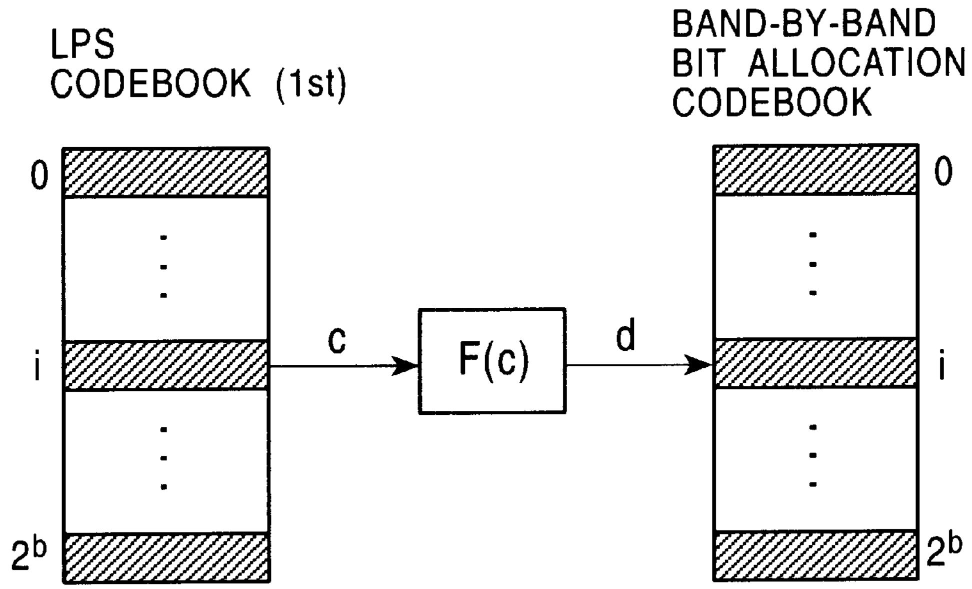
FIG. 8 illustrates a creation of a codebook in a signal processing apparatus of this embodiment.

In the following, a description is given of a signal processing apparatus in a case where only the quantized result of the first stage is used. Initially, parameter conversions are performed in advance for all the code vectors c contained in the code vector $c_1$ of the first stage of an LSP quantization, thereby creating a codebook $D_1$. When the number of quantization bits is denoted as b, as shown in FIG. 8, a codebook $D_1$ is created. That is, a code vector at a certain index position of the codebook $C_1$ is extracted, this code vector is converted by the parameter conversion function F, and this is stored at the same index position as that of the codebook $D_1$.

Figure 9:
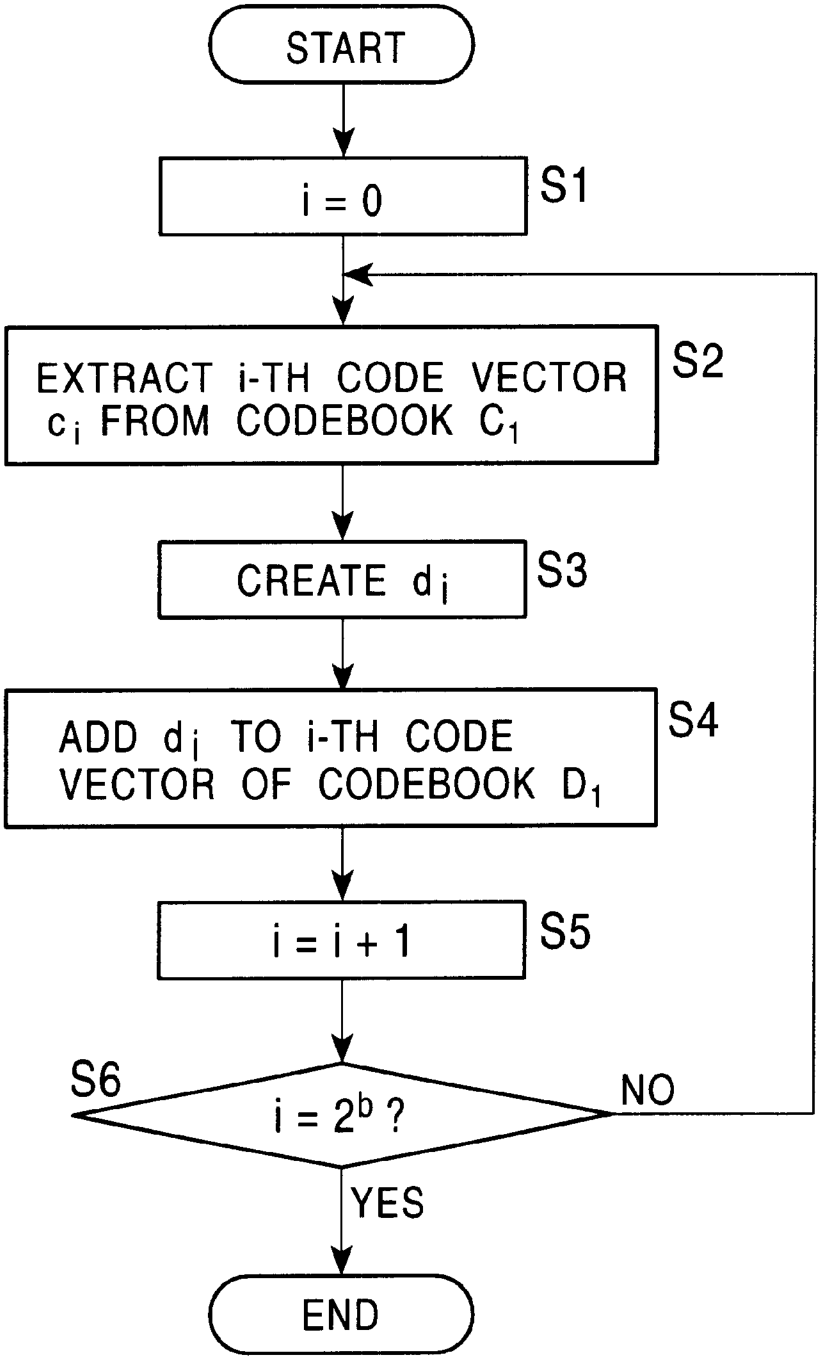
FIG. 9 is a flowchart illustrating a codebook creation procedure in the signal processing apparatus.

The procedure of creating this codebook $D_1$ is shown in FIG. 9. Initially, in step S1, the initial value of i is set to 0.

Next, in step S2, the i-th code vector $c_i$ of the codebook $C_1$ is extracted. In step S3, the code vector $c_i$ is converted by the parameter conversion function F in order to create a code vector $d_i$.

Next, in step S4, the code vector $c_i$ is added to the i-th code vector of the codebook $D_1$.

Next, in step S5, 1 is added to i. In the subsequent step S6, a determination is made as to whether or not i has reached $2^b$. When it is determined in step S6 that i has not reached $2^b$, the process returns to step S2, where the same processes are repeated. When it is determined in step S6 that i has reached $2^b$, the creation of the codebook $D_i$ is terminated.

In the signal processing apparatus of this embodiment, a conversion of a parameter is performed by a look-up of the codebook $D_i$ which is created in the above-described manner.

Figure 10:
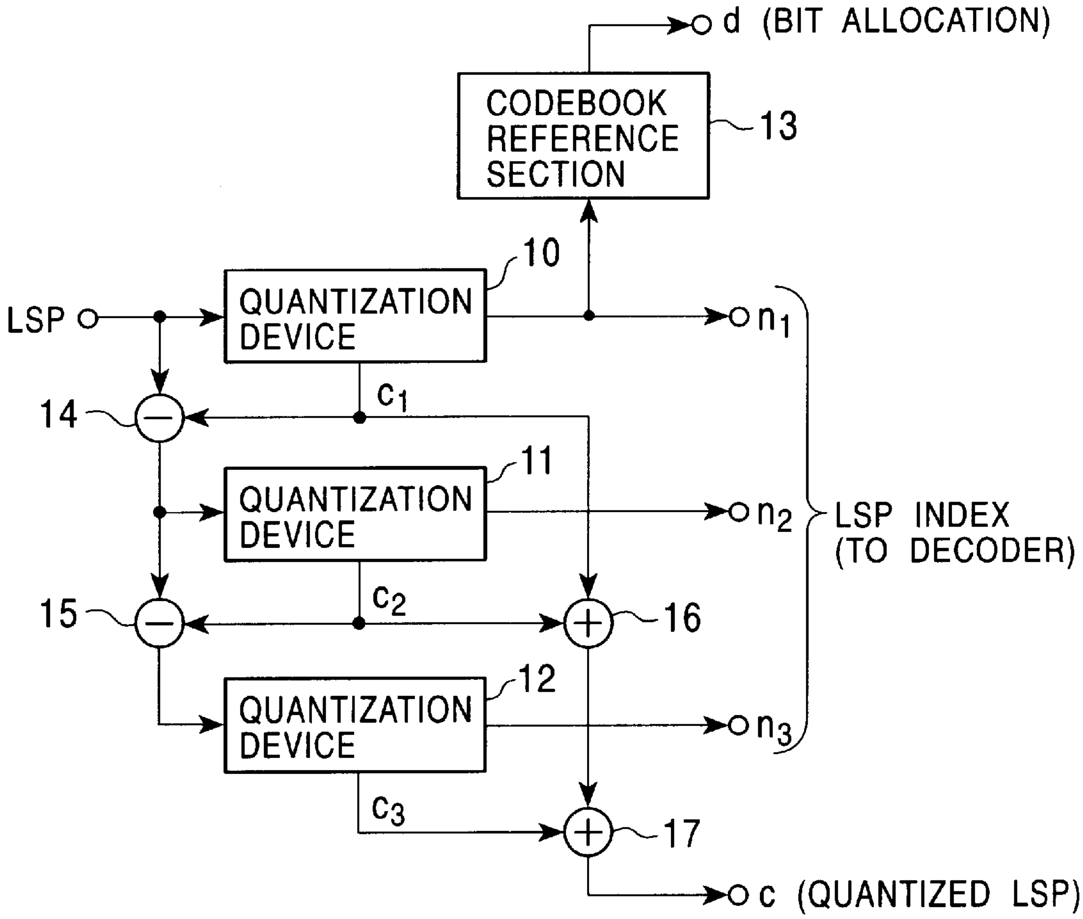
FIG. 10 illustrates an overall construction on an encoder side of the signal processing apparatus.

The overall construction of this signal processing apparatus is shown in FIG. 10. As shown in FIG. 10, the signal processing apparatus of this embodiment comprises quantization devices 10 to 12, a codebook referring section 13, subtractors 14 and 15, and adders 16 and 17.

The LSP coefficient which is a first input parameter is quantized by the quantization device 10, and a quantized output $c_1$ is output. The quantized output $c_1$ is subtracted from the input LSP coefficient in the subtractor 14, and a quantized error thereof is quantized by the quantization device 11.

Similarly, a quantized output $c_2$ is subtracted from the input value of the quantization device 11, and a quantized error thereof is quantized by the quantization device 12.

The quantized outputs $c_1$, $c_2$, $c_3$ are added by the adders 16 and 17 and become a quantized LSP. Furthermore, in the codebook referring section 13, the look-up of the codebook $D_1$ is performed by the LSP index $n_1$ of the first stage, and band-by-band bit allocation information d which is a second parameter is created.

The LSP indexes $n_1$, $n_2$, $n_3$ for each quantization stage are supplied to the decoder side.

Figure 11:
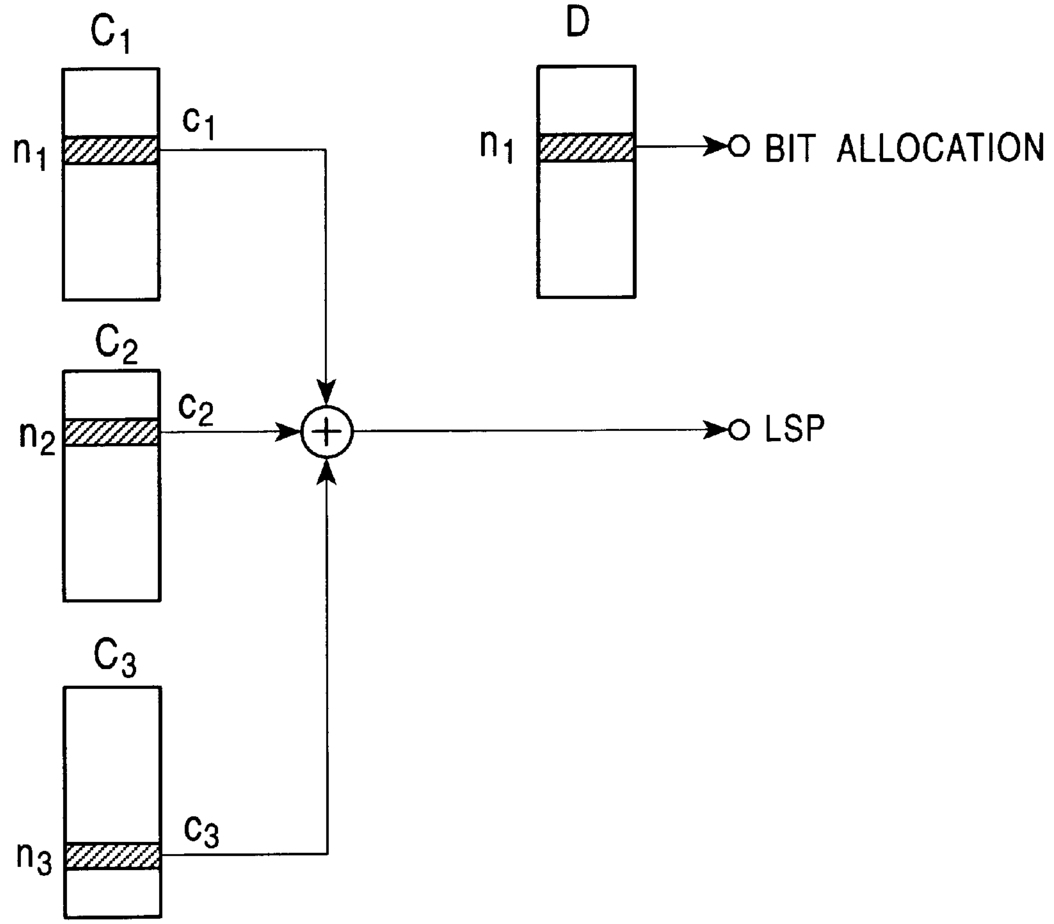
FIG. 11 illustrates a look-up of a codebook in a codebook referring section of the signal processing apparatus.

Here, as shown in FIG. 11, the look-up of the codebook $D_1$ in the codebook referring section 13 is performed by looking up the codebook $D_1$ by the LSP index $n_1$ at which the quantized output $c_1$ is output in the quantization device 10, and band-by-band bit allocation information d is created.

Figure 12:
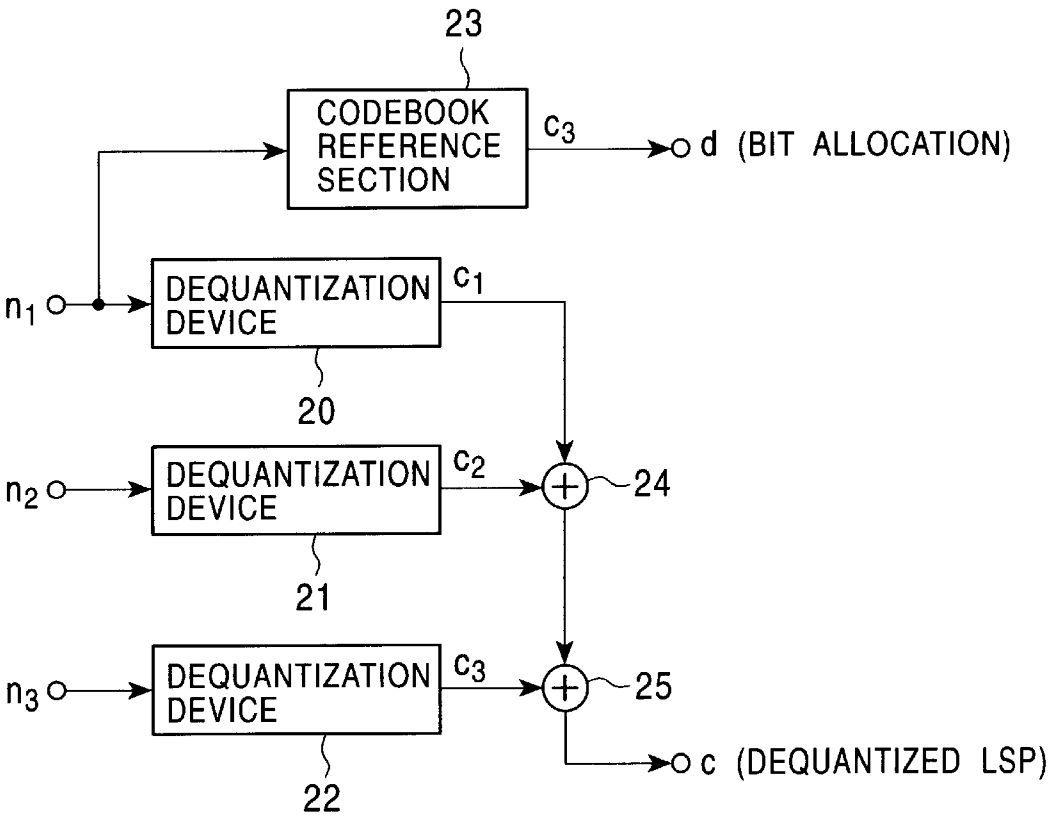
FIG. 12 illustrates an overall construction on a decoder side of the signal processing apparatus.

As the overall construction of the decoder side is shown in FIG. 12, the decoder comprises dequantization devices 20 to 22, a codebook referring section 23, and adders 24 and 25.

LSP indexes $n_1$, $n_2$, $n_3$ supplied from the encoder side are input to the dequantization devices 20 to 22, and dequantized outputs $c_1$, $c_2$, $c_3$ are output, respectively. The dequantized outputs $c_1$, $c_2$, $c_3$ are added by the adders 24 and 25, and become a dequantized LSP. Furthermore, the LSP index $n_1$ is input to the codebook referring section 23, and by looking up the codebook $D_1$, band-by-band bit allocation information d is created.

As described above, according to the signal processing apparatus in this embodiment, since calculations for parameter conversions are not performed, computation errors do not occur between the encoder side and the decoder side. Furthermore, the number of computations in the signal processing apparatus can be reduced.

Next, a description is given of an example in which the signal processing apparatus of this embodiment is used in the signal coding apparatus and the signal decoding apparatus shown in FIGS. 6 and 7. Of course, in addition to the signal coding apparatus and the signal decoding apparatus shown in FIGS. 6 and 7, the signal processing apparatus can be used in other signal coding apparatuses and signal decoding apparatuses. In the following, only the essential portions are described.

Figure 13:
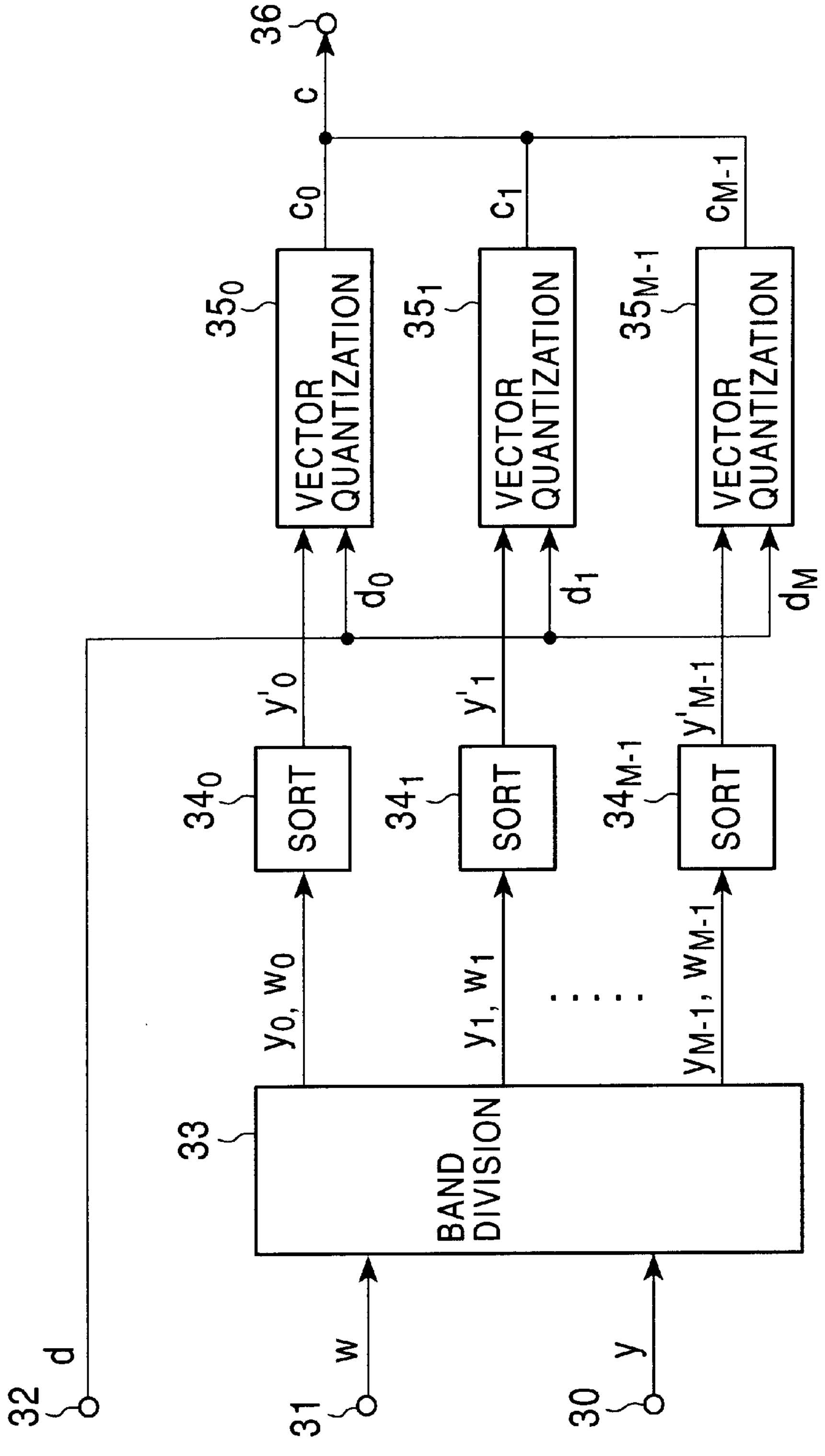
FIG. 13 illustrates a construction of the essential portions of a signal coding apparatus in which the signal processing apparatus is used.

First, the overall construction of the essential portions of the signal coding apparatus is shown in FIG. 13. FIG. 13 corresponds to the construction of the coefficient quantization circuit 235 of the signal coding apparatus shown in FIG. 6. In FIG. 13, coefficient data on a frequency axis, obtained by performing an orthogonal transform on a time-axis signal, is supplied to an input terminal 30. A weight w calculated on the basis of parameters, such as an LPC coefficient, a pitch parameter, and a Bark scale factor, is input to an input terminal 31. Furthermore, band-by-band bit allocation information d created in the codebook referring section 13 in FIG. 10 is input to an input terminal 32. Here, a coefficient for one frame of an orthogonal transform is denoted as vector y, and a weight for one frame is denoted as vector w. Furthermore, bit allocation information for one frame is denoted as vector d.

The coefficient vector y and the weight vector w are sent to a band dividing circuit 33 as necessary so that these are divided into M ($M \geqq 1$) bands. Examples of the number of bands are approximately 3 bands (M=3) of low frequencies, medium frequencies, and high frequencies. However, the number of bands is not limited to this example, and the band division does not need to be performed. When the coefficient for each of these bands, for example, the coefficient of the k-th band, is denoted as $y_k$ and the weight as $w_k$ ($0 \leqq k \leqq M-1$), the following are satisfied:

$$y=(Y_0, y_1, \ldots, y_{M-1})$$

$$w=(w_0, w_1, \ldots, w_{M-1})$$

The number of bands for this band division and the number of coefficients for each band are fixed to preset numerical values.

Next, the coefficient vectors $y_0$, $Y_1$, . . . , $y_{M-1}$ of each band are sent to sort circuits $\mathbf{34}_0$, $\mathbf{34}_1$, . . . , $\mathbf{34}_{M-1}$, respectively, where an order is assigned, for each band, to the coefficient within each band according to the order of the weight. For this ordering, the coefficients themselves within each band may be rearranged (sorted) in accordance with the order of weight. Additionally, only the indexes indicating the position or the order on a frequency axis of each coefficient may be sorted according to the order of weight. When the coefficients themselves are sorted, with respect to the arbitrary k-th band, the respective coefficients of the coefficient vector $y_k$ are sorted in weight order, and a coefficient vector $y'_k$ sorted in weight order is obtained.

Next, the coefficient vectors $y'_0$, $y'_1$, . . . , $y'_{M-1}$ which are sorted for each band according to the weight order are sent to vector quantization devices $\mathbf{35}_0$, $\mathbf{35}_1$, . . . , $\mathbf{35}_{M-1}$, respectively. Vectors $d_0$, $d_1$, . . . , $d_{M-1}$ of bit allocation information, input to the input terminal 32, are also input to vector quantization devices $\mathbf{35}_0$, $\mathbf{35}_1$, . . . , $\mathbf{35}_{M-1}$, respectively, and vector quantizations are performed in accordance with the bit allocation information $d_0$, $d_1$, . . . , $d_{M-1}$.

Next, vectors $c_0$, $c_1$, . . . , $c_{M-1}$ of the coefficient index for each band from the vector quantization devices $\mathbf{35}_0$, $\mathbf{35}_1$, . . . , $\mathbf{35}_{M-1}$ of FIG. 13 are collectively denoted as a vector c of the coefficient indexes of all the bands, and this vector is taken out from a terminal 36.

With such a construction, the signal coding apparatus quantizes the input coefficient data in accordance with the bit allocation information.

Although this signal coding apparatus of FIG. 13 is shown as hardware construction, the signal coding apparatus can also be realized by software means by using a commonly-called DSP (Digital Signal Processor), etc.

Figure 14:
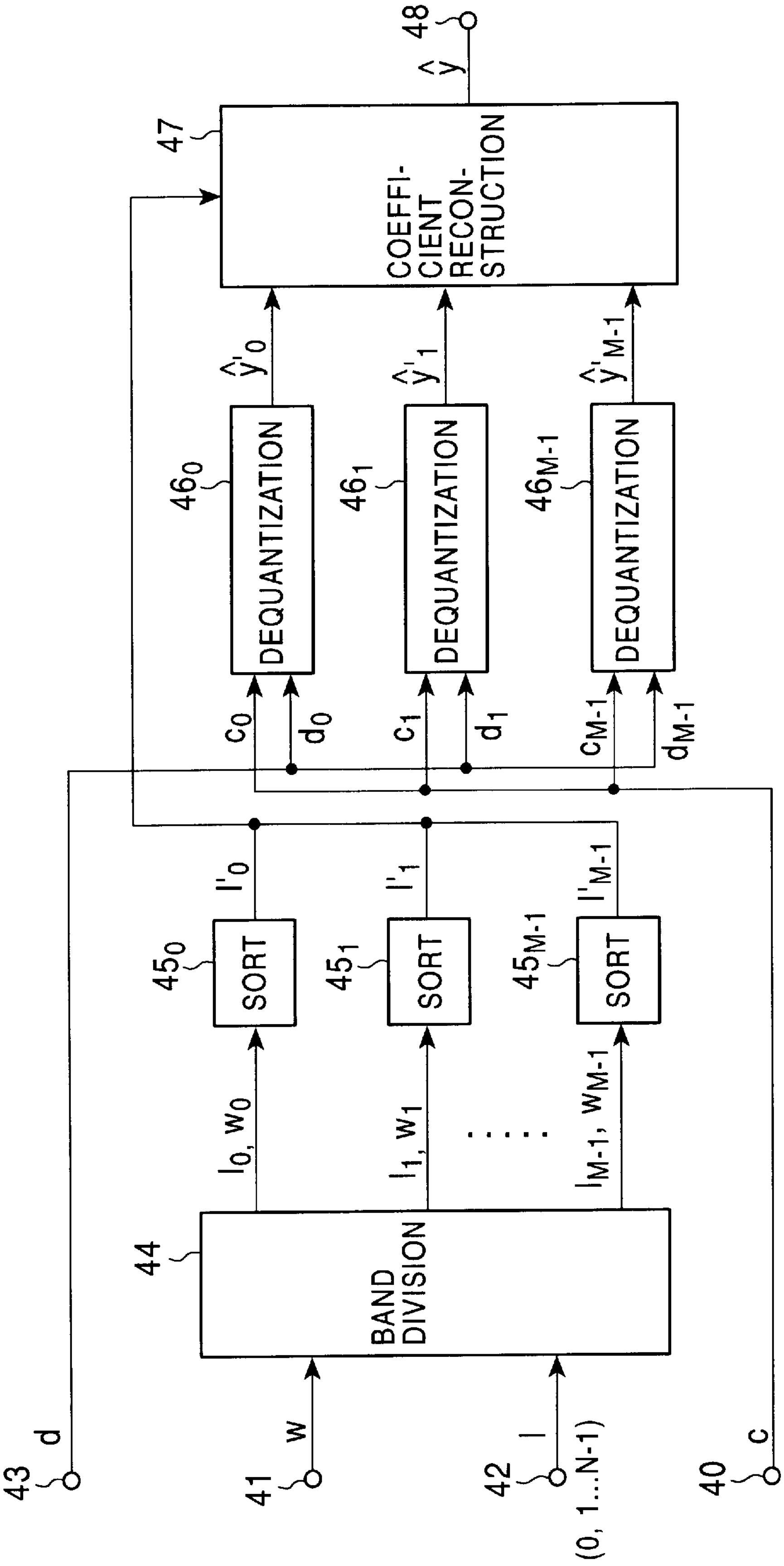
FIG. 14 illustrates a construction of the essential portions of a signal decoding apparatus in which the signal processing apparatus is used.

Next, the construction of the essential portions of the signal decoding apparatus is shown in FIG. 14. FIG. 14 corresponds to the construction of the coefficient dequantization circuit 261 shown in FIG. 7. In FIG. 14, a coefficient index (a codebook index obtained by quantizing an orthogonal transform coefficient, such as an MDCT coefficient) is input to an input terminal 40. Furthermore, a weight W (ω) calculated on the basis of an α parameter (LPC coefficient), a pitch lag, a pitch gain, a Bark scale factor, etc., is input to an input terminal 41. An index indicating the position or the order of a coefficient on a frequency axis, that is, a numerical value of 0 to N−1 (this is denoted as a vector I) when there are N pieces of coefficient data in all the bands, is supplied to an input terminal 42. N weights for the N coefficients, input to the input terminal 41, are denoted as vector w. Furthermore, band-by-band bit allocation information d created by the codebook referring section 23 shown in FIG. 12 is input to an input terminal 43. N pieces of bit allocation information for each of the N coefficients input to the input terminal 43 are denoted as vector d.

The weight w and the index I are sent to a band dividing circuit 44, where these are divided into M bands similarly to the encoder side. If these are divided into three bands (M=3) of low frequencies, medium frequencies, and high frequencies on the encoder side, similarly, these are also divided into three bands on the decoder side. The index and the weight for each band, divided into three bands, are sent to the sort circuits $45_0$, $45_1$, . . . , $45_{M-1}$, respectively. For example, the index $I_k$ and the weight $w_k$ within the k-th band are sent to the k-th sort circuit $45_k$. In the sort circuit $45_k$, the index $I_k$ within the k-th band is rearranged (sorted) according to the order of the weight $w_k$ of each coefficient, and the sorted index $I'_k$ is output. The indexes $I_0$, $I_1$, . . . , $I_{M-1}$ which are sorted for each band from the sort circuits $45_0$, $45_1$, . . . , $45_{M-1}$, respectively, are supplied to a coefficient reconstruction circuit 47.

The index of the orthogonal transform coefficient input to the input terminal 40 is obtained in such a way that a coefficient which is divided into M bands and which is sorted in weight order for each band when the coefficient is quantized on the encoder side is subjected to a vector quantization for each subvector which is divided in units of a number of pieces based on a predetermined rule within one band. Specifically, for M bands, a set of coefficient indexes for each band is denoted as vectors $c_0$, $c_1$, . . . , $c_{M-1}$, respectively. The vectors $c_0$, $c_1$, . . . , $c_{M-1}$ of the coefficient indexes of each of these bands are sent to dequantization devices $46_0$, $46_1$, . . . , $46_{M-1}$, respectively. The vectors $d_0$, $d_1$, . . . , $d_{M-1}$ of the bit allocation information input to the input terminal 43 are also input to the dequantization devices $46_0$, $46_1$, . . . , $46_{M-1}$, respectively, and dequantizations are performed in accordance with the bit allocation information $d_0$, $d_1$, . . . , $d_{M-1}$.

The coefficient data obtained as a result of dequantization being performed by the dequantization devices $46_0$, $46_1$, . . . , $46_{M-1}$ corresponds to that which is sorted in the weight order within each band, that is, the coefficient vectors $y'_0$, $y'_1$, . . . , $y'_{M-1}$ from the sort circuits $34_0$, $34_1$, . . . , $34_{M-1}$ of FIG. 13, and the arrangement order differs from the position on the frequency axis. Therefore, the coefficient reconstruction circuit 47 has the functions such that the index I indicating the position on the frequency axis is sorted in advance according to the weight, and the arrangement order is returned to the original order on the time axis in such a manner as to cause this sorted index to correspond to the coefficient data obtained by dequantization. That is, in the coefficient reconstruction circuit 47, the index sorted for each of the bands, from each of the sort circuits $45_0$, $45_1$, . . . , $45_{M-1}$, is made to correspond to the coefficient data sorted in weight order within each band, from each of the dequantization devices $46_0$, $46_1$, . . . , $46_{M-1}$, and the coefficient data dequantized according to this sorted index is rearranged (inversely sorted), thereby obtaining the coefficient data y arranged in the original order on the time axis, and this data is taken out from an output terminal 48.

As described above, according to the signal coding apparatus and the signal decoding apparatus in which the signal processing apparatus of this embodiment is used, since calculations for parameter conversions are not performed, computation errors do not occur between the encoder side and the decoder side, and the number of computations can be reduced.

The present invention is not limited to the above-described embodiments, and of course, various modifications are possible within the spirit and scope of the present invention.

For example, in the foregoing, a description is given by distinguishing a weight w for sorting and band-by-band bit allocation information d. In addition, the signal processing apparatus of this embodiment can be used in a signal coding apparatus which quantizes an orthogonal transform coefficient to which a weight is assigned and which codes the orthogonal transform coefficient. In this case, when a weight for a weight quantization as a second parameter is to be determined, a table can be referred to.

In addition, in the foregoing, band-by-band bit allocation information is determined on the basis of an LSP coefficient. In addition, band-by-band bit allocation information may be determined on the basis of another parameter, such as an LPC coefficient.

What is claimed is:

1. A signal processing apparatus for performing signal processing associated with a quantization on a first input parameter, the signal processing apparatus comprising:

quantization means for quantizing the first input parameter; and table referring means for preparing a table in which a result of a conversion of each representative value of a codebook is prestored and for determining a second input parameter by referring to the table by using an index of a quantized output from the quantization means when the second input parameter is determined on the basis of the first input parameter quantized by the quantization means.

2. The signal processing apparatus according to claim 1, wherein a quantization in the quantization means is a multistage vector quantization of N stages, and the table referring means determines the second input parameter by referring to the table by using indexes of quantized outputs up to the M-th (M≦N) stage.

3. The signal processing apparatus according to claim 2, wherein, when the conversion is non-linear, the table referring means determines the second input parameter by referring to the table by using an index of a quantized output of a first stage of said N stages.

4. The signal processing apparatus according to claim 1, wherein the first parameter is a line spectrum pair parameter, and the second parameter is bit allocation information of a coefficient quantization.

5. A signal processing method for performing signal processing associated with a quantization on a first input parameter, the signal processing method comprising:

a quantization step of quantizing the first input parameter; and a table referring step of preparing a table in which a result of a conversion of each representative value of a codebook is prestored and determining a second parameter by referring to the table by using an index of a quantized output in the quantization step when the second input parameter is determined on the basis of the first input parameter quantized in the quantization step.

6. The signal processing method according to claim 5, wherein quantization in the quantization step is a multistage vector quantization of N stages and the second input parameter is determined in the table referring step by referring to the table by using indexes of quantized outputs up to an M-th (M≦N) stage.

7. The signal processing method according to claim 6, wherein, when the conversion is non-linear, in the table referring step, the second parameter is determined by referring to the table by using an index of a quantized output of a first stage of said N stages.

8. The signal processing method according to claim 5, wherein the first parameter is a line spectrum pair parameter, and the second parameter is bit allocation information of a coefficient quantization.

9. A signal coding apparatus for performing coding by performing an orthogonal transform on a signal based on an input signal on a time axis and by performing bit allocation quantization on an obtained orthogonal transform coefficient, the signal coding apparatus comprising:

orthogonal transform means for performing said orthogonal transform on said signal based on the input signal;

parameter quantization means for quantizing a parameter based on the input signal;

table referring means for preparing a table in which a result of a conversion of each representative value of a codebook is prestored and for determining bit allocation information by referring to the table by using an index of a quantized output from the parameter quantization means when the bit allocation information is determined on the basis of the parameter quantized by the parameter quantization means; and quantization means for performing said bit allocation quantization on the orthogonal transform coefficient obtained by the orthogonal transform means on the basis of the bit allocation information determined by the table referring means.

10. The signal coding apparatus according to claim 9, further comprising, on an input side of the orthogonal transform means, a linear prediction coding (LPC) inverse filter for outputting an LPC predicative residue of the input signal on the basis of an LPC coefficient obtained by performing linear predicative coding on the input signal.

11. The signal coding apparatus according to claim 10, wherein the parameter is a linear spectrum pair parameter based on the LPC coefficient.

12. The signal coding apparatus according to claim 9, wherein the quantization in the quantization means is a multistage vector quantization of N stages, and the table referring means determines the bit allocation information by referring to the table by using indexes of quantized outputs up to an M-th (M≦N) stage.

13. The signal coding apparatus according to claim 12, wherein, when the conversion is non-linear, the table referring means determines the bit allocation information by referring to the table by using an index of a quantized output of a first stage of said N stages.

14. A signal coding method for performing coding by performing an orthogonal transform on a signal based on an input signal on a time axis and by performing a bit allocation quantization on an obtained orthogonal transform coefficient, the signal coding method comprising:

an orthogonal transform step of performing an orthogonal transform on a signal based on the input signal;

a parameter quantization step of quantizing a parameter based on the input signal;

a table referring step of preparing a table in which a result of a conversion of each representative value of a codebook is prestored and determining bit allocation information by referring to the table by using an index of a quantized output in the parameter quantization step when the bit allocation information is to be determined on the basis of the parameter quantized in the parameter quantization step; and a quantization step of performing the bit allocation quantization on the orthogonal transform coefficient obtained in the orthogonal transform step on the basis of the bit allocation information determined in the table referring step.

15. The signal coding method according to claim 14, further comprising a step of outputting a linear predictive coding (LPC) predicative residue of the input signal on the basis of an LPC coefficient obtained by performing linear predicative coding on the input signal prior to the orthogonal transform step.

16. The signal coding method according to claim 15, wherein the parameter is an LSP parameter based on the LPC coefficient.

17. The signal coding method according to claim 15, wherein the quantization in the quantization means is a multistage vector quantization of N stages and the bit allocation information is determined in the table referring step by referring to the table by using indexes of quantized outputs up to an M-th (M≦N) stage.

18. The signal coding method according to claim 17, wherein, when the conversion is non-linear the bit allocation information is determined in the table referring step by referring to the table by using an index of a quantized output of a first stage of said N stages.

19. A signal processing apparatus for inputting an index of a quantized output from quantization means and for performing signal processing associated with dequantization, the signal processing apparatus comprising:

dequantization means for dequantizing the index; and table referring means for preparing a table in which a result of a conversion of each representative value of a codebook is prestored and for creating a parameter by referring to the table by using the index.

20. The signal processing apparatus according to claim 19, wherein quantization in the quantization means is a multistage vector quantization of N stages, and the table referring means creates the parameter by referring to the table by using the indexes up to an M-th (M≦N) stage among the indexes up to an N-th stage.

21. The signal processing apparatus according to claim 20, wherein, when the conversion is non-linear, the table referring means creates the parameter by referring to the table by using an index of a first stage.

22. A signal processing method for inputting an index of a quantized output in quantization means and for performing signal processing associated with dequantization, the signal processing method comprising:

a dequantization step of dequantizing the index; and a table referring step of preparing a table in which a result of a conversion of each representative value of a codebook is prestored and creating a parameter by referring to the table by using the index.

23. The signal processing method according to claim 22, wherein quantization in the quantization means is a multistage vector quantization of N stages and the parameter is created in the table referring step by referring to the table by using the indexes up to an M-th (M≦N) stage among the indexes up to an N-th stage.

24. The signal processing method according to claim 23, wherein, when the conversion is non-linear the parameter is created in the table referring step by referring to the table by using the index of a first stage of said N stages.

25. A signal decoding apparatus for inputting at least an index of a quantized output of a first parameter and a coded orthogonal transform coefficient from a signal coding apparatus that quantizes the first parameter based on an input signal and performs bit allocation quantization on an orthogonal transform coefficient based on created bit allocation information by referring to a table in which a result of a conversion of each representative value of a codebook is prestored based on the first parameter when coding is performed by an orthogonal transform on the input signal on a time axis and by performing a bit assignment quantization on the orthogonal transform coefficient, the signal decoding apparatus comprising:

table referring means for creating bit allocation information by referring to the table based on the index;

dequantization means for dequantizing the orthogonal transform coefficient on the basis of the bit allocation information created by the table referring means; and inverse orthogonal transform means for performing an inverse orthogonal transform on the orthogonal transform coefficient which is dequantized by the dequantization means.

26. The signal decoding apparatus according to claim 25, wherein the first parameter is a linear spectrum pair (LSP) coefficient, the signal decoding apparatus further comprising:

parameter dequantization means for creating an LSP coefficient by dequantizing the index;

coefficient conversion means for converting the LSP coefficient into a linear prediction coding coefficient (LPC); and LPC synthesis means for performing an LPC synthesis on the LPC coefficient which is subjected to the inverse orthogonal transform on the basis of the LPC coefficient by the inverse orthogonal transform means.

27. The signal decoding apparatus according to claim 25, wherein quantization of the first parameter is a multistage vector quantization of N stages, and the table referring means creates the bit allocation information by referring to the table by using the indexes up to an M-th (M≦N) stage among the indexes up to the N-th stage.

28. The signal decoding apparatus according to claim 27, wherein, when the conversion is non-linear, the table referring means creates the bit allocation information by referring to the table by using the index of a first stage of said N stages.

29. A signal decoding method for inputting at least an index of a quantized output of a first parameter and a coded orthogonal transform coefficient from a signal coding apparatus that quantizes the first parameter based on an input signal and performs a bit allocation quantization on the orthogonal transform coefficient on the basis of created bit allocation information by referring to a table in which a result of a conversion of each representative value of a codebook is prestored when coding is performed by performing an orthogonal transform on the input signal on a time axis and by performing the bit allocation quantization on the obtained orthogonal transform coefficient, and for decoding the orthogonal transform coefficient on the basis of the index, the signal decoding method comprising:

a table referring step of creating bit allocation information by referring to the table on the basis of the index;

a dequantization step of dequantizing the orthogonal transform coefficient on the basis of the bit allocation information created in the table referring step; and an inverse orthogonal transform step of performing an inverse orthogonal transform on the orthogonal transform coefficient which is dequantized in the dequantization step.

30. The signal decoding method according to claim 29, wherein the first parameter is a linear spectrum pair (LSP) coefficient, the signal decoding method further comprising:

a parameter dequantization step of creating an LSP coefficient by dequantizing the index;

a coefficient conversion step of converting the LSP coefficient into a linear prediction coding (LPC) coefficient; and an LPC synthesis step of performing LPC synthesis on the orthogonal transform coefficient which is subjected to inverse orthogonal transform on the basis of the LPC coefficient in the inverse orthogonal transform step.

31. The signal decoding method according to claim 29, wherein quantization of the first parameter is a multistage vector quantization of N stages and the bit allocation information is created in the table referring step by referring to the table by using the indexes up to an M-th (M≦N) stage among the indexes up to an N-th stage.

32. The signal decoding method according to claim 31, wherein, when the conversion is non-linear the bit allocation information in the table referring step is created by referring to the table by using the index of a first stage of said N stages.

* * * * *